United States Patent
Zhang

(10) Patent No.: US 8,461,892 B1
(45) Date of Patent: Jun. 11, 2013

(54) INTERPOLATION CIRCUIT AND INTERPOLATION SYSTEM

(71) Applicant: IpGoal Microelectronics(Sichuan) Co., Ltd, Sichuan (CN)

(72) Inventor: Ziche Zhang, Chengdu (CN)

(73) Assignee: IPGoa Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/626,831

(22) Filed: Sep. 25, 2012

(30) Foreign Application Priority Data

Dec. 6, 2011 (CN) .......................... 2011 1 0399015

(51) Int. Cl.
*H03H 11/16* (2006.01)

(52) U.S. Cl.
USPC .......................................... 327/231; 327/237

(58) Field of Classification Search
None
See application file for complete search history.

(56) References Cited

U.S. PATENT DOCUMENTS

| | | | |
|---|---|---|---|
| 7,102,404 B2* | 9/2006 | Chansungsan | 327/161 |
| 8,063,686 B1* | 11/2011 | Naviasky et al. | 327/231 |
| 2012/0086513 A1* | 4/2012 | Gilbert | 330/288 |

* cited by examiner

*Primary Examiner* — Cassandra Cox

(57) ABSTRACT

An interpolation circuit, includes a bias generating module, a load module consisting of a current source sub-module and a load resistance sub-module, first and second clock control modules, and an output module. The first clock control module includes a first input sub-module, a first source terminal negative feedback sub-module, a first multiplex switch sub-module and a first multiplex current sink sub-module. The bias generating module includes first, second and third FETs, and a bias current terminal. The current source sub-module includes fourth and fifth FETs. The load resistance sub-module includes first and second resistors. The first input sub-module includes sixth and seventh FETs. The first source terminal negative feedback sub-module includes a third resistor and a first capacitor. The first multiplex switch sub-module includes first and second groups of switches. The first multiplex current sink sub-module includes first and second groups of FETs. An interpolation system is further provided.

11 Claims, 3 Drawing Sheets

INTERPOLATION CIRCUIT AND INTERPOLATION SYSTEM

BACKGROUND OF THE PRESENT INVENTION

1. Field of Invention

The present invention relates to an interpolator, and more particularly to an interpolation circuit having a high speed, a high linearity and a high bandwidth, and an interpolation system thereof.

2. Description of Related Arts

High-linearity interpolators are widely adopted in data receiving and transmitting systems, e.g., in function modules such as data sampling module and frequency jitter generating module. Under different digit layout word, a linear interpolator is capable of generating uniform multi-phase clocks. A high-performance data receiving and transmitting system requires the clocks to have extremely high linearity and uniformity.

As shown in FIG. 1, working principles of an interpolator are as following. By inputting Ain and Bin, source synchronous clocks are respectively obtained after different delays. The source synchronous clocks have a phase difference of $\Phi$, which shows up as a time delay tDelay. The interpolator has a phase rotator control word input: PH<0: X>. The control word input controls phase mass of a signal output by an interpolation unit, wherein $X \in N[1, +\infty)$. During the process that the phase rotator control word PH<0: X> changes from a minimum value $(0, \ldots, 0)$ to a maximum value $(1, \ldots, 1)$, an output of the interpolator uniformly changes from a front phase Ain to a rear phase Bin, wherein the step size of changing is $\Phi/2^{(X+1)}$.

In conventional interpolation circuits, due to limitations of the circuit structure, and especially the constantly improving of the circuit speed (the operating speed>1G), the bandwidth of conventional circuit structures, the linearity and the output swing of interpolators, all decrease greatly. Thus, it is necessary to provide an interpolation circuit having a high speed, a high linearity and a high bandwidth, and an interpolation system thereof.

SUMMARY OF THE PRESENT INVENTION

In view of the descriptions mentioned above, it is necessary to provide an interpolation circuit having a high speed, a high linearity and a high bandwidth, and an interpolation system thereof.

An interpolation circuit, comprises:
a bias generating module,
a load module,
a first clock control module connected with the bias generating module and the load module,
a second clock control module connected with the bias generating module and the load module, and
an output module,
wherein the load module comprises a current source sub-module and a load resistance sub-module,
the first clock control module comprises a first input sub-module, a first source terminal negative feedback sub-module, a first multiplex switch sub-module and a first multiplex current sink sub-module,
the second clock control module and the first clock control module are symmetrical in structure,
the bias generating module comprises a first field effect transistor (FET), a second FET connected with the first FET, a third FET connected with the second FET, and a bias current terminal connected with the first FET, the current source sub-module comprises a fourth FET, and a fifth FET connected with the fourth FET,
the load resistance sub-module comprises a first resistor connected with the fourth FET, and a second resistor connected with the fifth FET,
the first input sub-circuit comprises a sixth FET, and a seventh FET connected with the sixth FET,
the first source terminal negative feedback sub-module comprises a third resistor connected between the sixth FET and the seventh FET, and a first capacitor connected in parallel with the third resistor,
the first multiplex switch sub-module comprises a first group of switches, and a second group of switches connected in parallel with the first group of switches,
the first multiplex current sink sub-module comprises a first group of FETs connected with the first group of switches, and a second group of FETs connected with the second group of switches.

An interpolation system, comprises:
a bias generating module for providing the interpolation system with a bias voltage required for operating,
a load module connected with the bias generating module,
a first clock control module connected with the bias generating module and the load module,
a second clock control module connected with the bias generating module and the load module, and
an output module connected with the load module,
wherein the load module comprises a current source sub-module for providing the interpolation system with an operating current required, and a load resistance sub-module connected with the current source sub-module for providing the interpolation system with a load required for operating,
the first clock control module comprises a first input sub-module for receiving a first clock having a zero phase, a first source terminal negative feedback sub-module connected with the first input sub-module for improving a linearity and a bandwidth of the interpolation system, a first multiplex switch sub-module connected with the first source terminal negative feedback sub-module for receiving a phase rotator control word input and a first multiplex current sink sub-module connected with the first multiplex switch sub-module,
the second clock control module comprises a second input sub-module, a second source terminal negative feedback sub-module connected with the second input sub-module, a second multiplex switch sub-module connected with the second source terminal negative feedback sub-module, and a second multiplex current sink sub-module connected with the second multiplex switch sub-module, and
the second clock control module and the first clock control module are symmetrical in structure.

Compared with the prior arts, the interpolation circuit and the interpolation system of the present invention have simple structures, and have characteristics of high speed, high linearity and high bandwidth.

These and other objectives, features, and advantages of the present invention will become apparent from the following detailed description, the accompanying drawings, and the appended claims.

DETAILED DESCRIPTION OF THE PREFERRED EMBODIMENT

Figure 1:
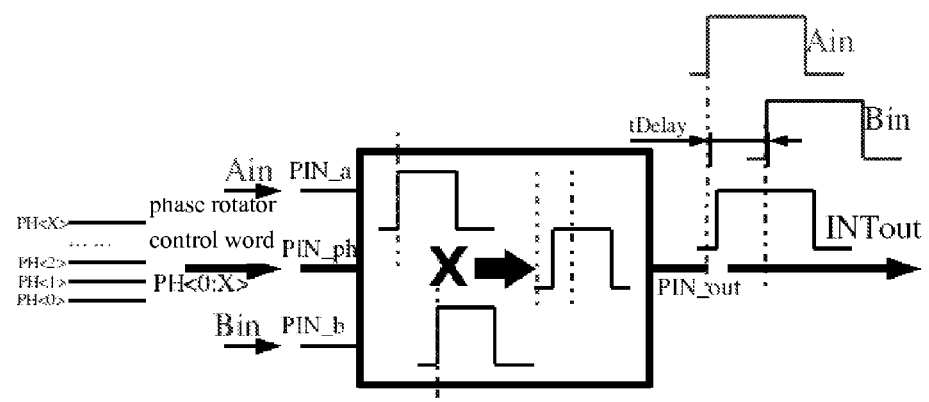
FIG. 1 is a schematic view of an interpolator according to a preferred embodiment of the present invention showing working principles of the interpolator.
Figure 2:
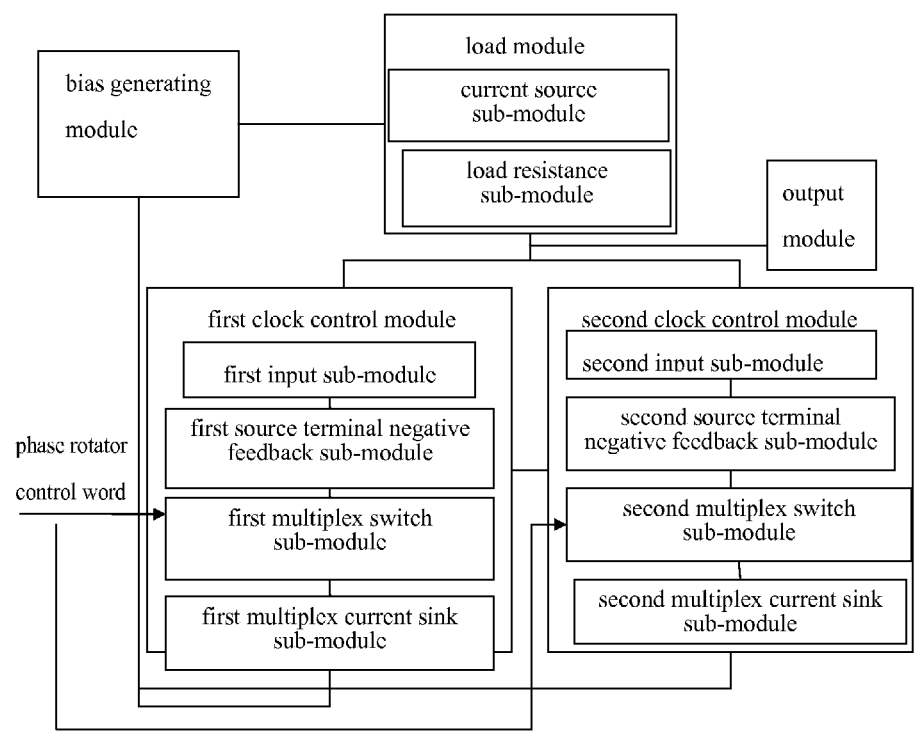
FIG. 2 is a block diagram of an interpolation system according to a preferred embodiment of the present invention.

Referring to FIG. 2 of the drawings, an interpolation system according to a preferred embodiment of the present invention is illustrated, comprising a bias generating module, a load module connected with the bias generating module, a first clock control module connected with the bias generating module and the load module, a second clock control module connected with the bias generating module and the load module, and an output module connected with the first clock control module and the second clock control module, and the load module. The load module comprises a current source sub-module, and a load resistance sub-module connected with the current source sub-module. The first clock control module comprises a first input sub-module, a first source terminal negative sub-module connected with the first input sub-module, a first multiplex switch sub-module, and a first multiplex current sink sub-module connected with the first multiples switch sub-module. The second clock control module and the first clock control module are symmetrical in structure. The second clock control module comprises a second input sub-module, a second source terminal negative feedback sub-module connected with the second input sub-module, a second multiplex switch sub-module connected with the second source terminal negative feedback sub-module, and a second multiplex current sink sub-module connected with the second multiplex switch sub-module.

The bias generating module is for providing the interpolation system with a bias voltage required for operating. The current source sub-module in the load module is for providing the interpolation system with a current required for operating. The load resistance sub-module is for providing the interpolation circuit with a load required for operating, and the load resistance sub-module is capable of maintaining relative stability of a swing of a signal output by the output module. The first input sub-module of the first clock control module is for receiving a first clock having a phase of zero. The first source terminal negative feedback sub-module is for improving a linearity and a bandwidth of the interpolation circuit, in such a manner that the interpolation system is capable of operating normally in a high-speed state. The first multiplex switch sub-module receives a phase rotator control word input, and controls a current generated by the first multiplex current sink module according to the phase rotator control word. The second input sub-module of the second clock control module is for receiving a second clock having a phase orthogonal to the phase of the first clock. The second source terminal negative feedback sub-module is for improving the linearity and the bandwidth of the interpolation circuit, in such a manner that the interpolation system is capable of operating normally in a high-speed state. The second multiplex switch sub-module receives a phase rotator control word input, and controls a current generated by the second multiplex current sink module according to the phase rotator control word received.

Figure 3:
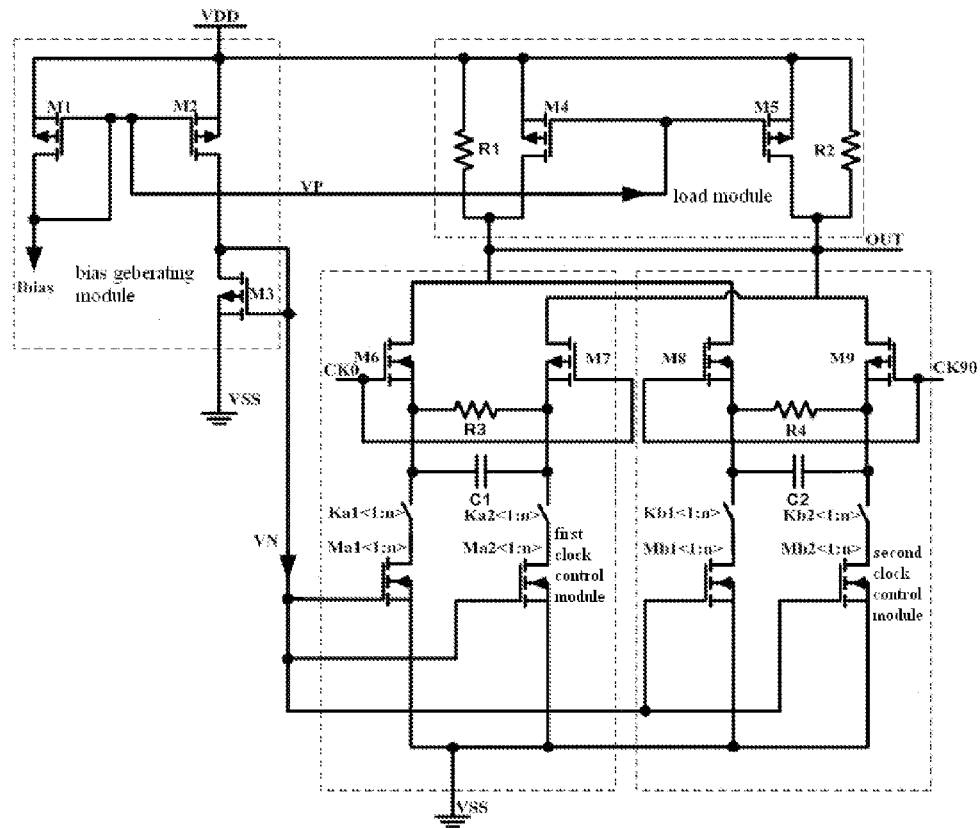
FIG. 3 is a circuit diagram of an interpolation circuit according to a preferred embodiment of the present invention.

Further referring to FIG. 3 of the drawings, FIG. 3 is a specific circuit diagram of the interpolation circuit according to the preferred embodiment of the present invention. The bias generating module comprises a first FET M1, a second FET M2, a third FET M3 and a bias current terminal Ibias. The current source sub-module comprises a fourth FET M4, and a fifth FET M5. The load resistance sub-module comprises a first resistor R1 and a second resistor R2. The first input sub-module comprises a six FET M6 and a seventh FET M7. The first source terminal negative feedback sub-module comprises a third resistor R3 and a first capacitor C1. The first multiplex switch sub-module comprises a first group of switches Ka1<1: n> and a second group of switches Ka2<1: n>, wherein each group of switches comprises n switches connected in parallel, wherein n is an optional natural number. The first multiplex current sink sub-module comprises a first group of FETs Ma1<1:n> respectively and correspondingly connected with the first group of switches Ka1<1:n>, and a second group of FETs Ma2<1:n> respectively and correspondingly connected with the second group of switches Ka2<1:n>, wherein each group of FETs comprises n FETs connected in parallel, and respectively and correspondingly connected with the n switches. The second input sub-module comprises an eighth FET M8 and a ninth FET M9. The second source terminal negative feedback sub-module comprises a fourth resistor R4 and a second capacitor C2. The second multiplex switch sub-module comprises a third group of switches Kb1<1:n> and a fourth group of switches Kb2<1: n>, wherein each group of switches comprises n switches connected in parallel. The second multiplex current sink sub-module comprises a third group of FETs Mb1<1:n> respectively and correspondingly connected with the first group of switches Kb1<1:n>, and a fourth group of FETs Mb2<1:n> respectively and correspondingly connected with the fourth group of switches Kb2<1:n>, wherein each group of FETs comprises n FETs connected in parallel, and respectively and correspondingly connected with the n switches. The output module is an output terminal OUT.

Specific circuit diagram connections of the interpolation circuit according to the preferred embodiment of the present invention are as following.

A grid electrode of the first FET M1, a drain electrode of the first FET M1, a grid electrode of the second FET M2, a grid electrode of the fourth FET M4, and a grid electrode of the fifth FET M5 are all connected with the bias current terminal Ibias, a drain electrode of the second FET M2, a grid electrode of the third FET M3, a drain electrode of the third FET M3, a grid electrode of each FET in the first group of FETs, a grid electrode of each FET in the second group of FETs, a grid electrode of each FET in the third group of FETs, and a grid electrode of each FET in the fourth group of FETs are all connected. A first terminal of the first resistor R1, a drain electrode of the fourth FET M4, a drain electrode of the fifth FET M5, a first terminal of the second resistor R2, a drain electrode of the sixth FET M6, a drain electrode of the seventh FET M7, a drain electrode of the eighth FET M8, and a drain electrode of the ninth FET M9 are all connected with the output terminal OUT. A grid electrode of the sixth FET M6 is connected with a grid electrode of the seventh FET M7, a grid electrode of the eighth FET M8 is connected with a grid electrode of the ninth FET M9, a source electrode of the sixth FET M6 is connected with a first terminal of the third resistor R3, a first terminal of the first capacitor C1, and a first terminal of each switch in the first group of switches Ka1<1:n>, a second terminal of each switch in the first group of switches Ka1<1:n> is respectively connected with a drain electrode of each FET coupled in the first group of FETs Ma1<1:n>. A source electrode of the seventh FET M7 is connected with a second terminal of the third resistor R3, a second terminal of the first capacitor C1, and a first terminal of each switch in the second group of switches Ma1<1:n>, a second terminal of the second group of switches is respectively connected with a drain electrode of each FET coupled in the second group of FETs Ma2<1:n>, a source electrode of the eighth FET M8 is connected with a first terminal of the fourth resistor R4, a first terminal of the second capacitor C2, and a first terminal of each switch in the third group of switches Kb1<1:n>, a second terminal of each switch in the third group of switches Kb1<1:n> is respectively connected with a drain electrode of each FET coupled in the third group of FETs Mb1<1:n>. A source electrode of the ninth FET M9 is connected with a second terminal of the fourth resistor R4, a second terminal of the second capacitor C2, and a first terminal of each switch in the fourth group of FETs Kb2<1:n>, a second terminal of each switch in the fourth group of switches Kb2<1:n> is respectively connected with a drain electrode of each FET coupled in the fourth group of FETs Mb2<1:n>. A source electrode of the first FET M1, a source electrode of the second FET M2, a second terminal of the first resistor R1, a source electrode of the fourth FET M4, a source electrode of the fifth FET M5, and a second terminal of the second resistor R2 are all connected with a power source terminal VDD. A source electrode of the third FET M3, a source electrode of each FET in the first group of FETs Ma1<1:n>, a source electrode of each FET in the second group of FETs Ma2<1:n>, a source electrode of each FET in the third group of FETs Mb1<1:n>, and a source electrode of each FET in the fourth group of FETs Mb2<1:n> are all connected with a ground terminal VSS.

Working principles of the interpolation circuit according to the preferred embodiment of the present invention are as following. The bias generating module respectively generates a first bias voltage VP and a second bias voltage VN. The first bias voltage VP is input to the grid electrode of the fourth FET M4 and the grid electrode of the fifth FET M5, so as to provide the load module with a bias voltage required for operating. The second bias voltage VN is input to the grid electrode of each FET of the first group of FETs Ma1<1:n>, the second group of FETs Ma2<1:n>, the third group of FETs Mb1<1:n>, and the fourth group of FETs Mb2<1:n>, so as to provide the first clock control module and the second clock control module with a bias voltage required for operating.

The grid electrode of the sixth FET M6 and the grid electrode of the seventh FET M7 together receive a first clock CK0 having a phase of zero. The grid electrode of the eighth FET M8 and the grid electrode of the ninth FET M9 together receive a second clock CK90 having a phase orthogonal to a phase of the first clock CK0. The first group of FETs Ma1<1:n>, the second group of FETs Ma2<1:n>, the third group of FETs Mb1<1:n>, and the fourth group of FETs Mb2<1:n> simultaneously receive the phase rotator control word input by external. According to the phase rotator control word input, the interpolation circuit mixes the phase of the first clock CK0 and the phase of the second clock CK90, and outputs a clock signal having a phase varying between the phases of the first clock CK0 and the second clock CK90.

Due to adopting of the third resistor R3 in the first source terminal negative feedback sub-module of the interpolation circuit, and adopting of the fourth resistor R4 in the second source terminal negative feedback sub-module of the interpolation circuit, the linearity of the interpolation circuit is improved. The existing of the third resistor R3 and the fourth resistor R4 reduces a gain, and at the same time reduces sensitivity of the gain, i.e., a size of the gain does not change significantly with an operating point.

Due to adopting of the first capacitor C1 in the first source terminal negative feedback sub-module of the interpolation circuit, and adopting of the second capacitor C2 in the second source terminal negative feedback sub-module, the bandwidth of the interpolation circuit is improved, so as to ensure a reliable operation of the interpolation circuit under a high-speed state.

Due to adopting of the first multiplex current sink sub-module and the second multiplex current sink sub-module in the interpolation circuit, rise time of a wave shape of a signal output by the interpolation circuit is basically the same as fall time thereof, thus improves a duty ratio thereof.

Due to adopting of the load resistance sub-module in the load module of the interpolation circuit, a swing of a signal output by an output module is capable of being maintained relatively stable.

The interpolation circuit and the interpolation system according to the preferred embodiment of the present invention have simple structures; and have characteristics of high speed, high linearity and high bandwidth.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An interpolation circuit, comprising
a bias generating module,
a load module,
a first clock control module connected with said bias generating module and said load module,
a second clock control module connected with said bias generating module and said load module, and
an output module,
wherein said load module comprises a current source sub-module and a load resistance sub-module,
said first clock control module comprises a first input sub-module, a first source terminal negative feedback sub-module, a first multiplex switch sub-module and a first multiplex current sink sub-module,
said second clock control module and said first clock control module are symmetrical in structure,
said bias generating module comprises a first field effect transistor (FET), a second FET connected with said first FET, a third FET connected with said second FET, and a bias current terminal connected with said first FET,
said current source sub-module comprises a fourth FET, and a fifth FET connected with said fourth FET,
said load resistance sub-module comprises a first resistor connected with said fourth FET, and a second resistor connected with said fifth FET,
said first input sub-circuit comprises a sixth FET, and a seventh FET connected with said sixth FET,
said first source terminal negative feedback sub-module comprises a third resistor connected between said sixth FET and said seventh FET, and a first capacitor connected in parallel with said third resistor,
said first multiplex switch sub-module comprises a first group of switches, and a second group of switches connected in parallel with said first group of switches, and
said first multiplex current sink sub-module comprises a first group of FETs connected with said first group of switches, and a second group of FETs connected with said second group of switches.

2. The interpolation circuit, as recited in claim 1, wherein said second clock control module comprises a second input sub-module, a second source terminal negative feedback sub-module, a second multiplex switch sub-module, and a second multiplex current sink sub-module, said second input sub-module comprises an eighth FET, and a ninth FET connected with said eighth FET, said second source terminal negative feedback sub-module comprises a fourth resistor connected between said eighth FET and said ninth FET, and a second capacitor connected in parallel with said fourth resistor, said second multiplex switch sub-module comprises a third group of switches, and a fourth group of switches connected in parallel with said third group of switches, said second multiplex current sink sub-module comprises a third group of FETs, and a fourth group of FETs connected in parallel with said fourth group of switches, and said output module is an output terminal.

3. The interpolation circuit, as recited in claim 1, wherein each said group of switches comprises n switches connected in parallel, each said group of FETs comprises n FETs connected in parallel, and respectively and correspondingly connected with said n switches, wherein n is an optional natural number.

4. The interpolation circuit, as recited in claim 2, wherein each said group of switches comprises n switches connected in parallel, each said group of FETs comprises n FETs connected in parallel, and respectively and correspondingly connected with said n switches, wherein n is an optional natural number.

5. The interpolation circuit, as recited in claim 2, wherein a grid electrode of said first FET, a drain electrode of said first FET, a grid electrode of said second FET, a grid electrode of said fourth FET, and a grid electrode of said fifth FET are all connected with said bias current terminal, a drain electrode of said second FET, a grid electrode of said third FET, a drain electrode of said third FET, a grid electrode of each FET in said first group of FETs, a grid electrode of each FET in said second group of FETs, a grid electrode of each FET in said third group of FETs, and a grid electrode of each FET in said fourth group of FETs are all connected, a first terminal of said first resistor, a drain electrode of said fourth FET, a drain electrode of said fifth FET, a first terminal of said second resistor, a drain electrode of said sixth FET, a drain electrode of said seventh FET, a drain electrode of said eighth FET, and a drain electrode of said ninth FET are all connected with said output terminal.

6. The interpolation circuit, as recited in claim 5, wherein a grid electrode of said sixth FET is connected with a grid electrode of said seventh FET, a grid electrode of said eighth FET is connected with a grid electrode of said ninth FET, a source electrode of said sixth FET is connected with a first terminal of said third resistor, a first terminal of said first capacitor, and a first terminal of each switch in said first group of switches, a second terminal of each switch in said first group of switches is respectively connected with a drain electrode of each FET coupled in said first group of FETs, a source electrode of said seventh FET is connected with a second terminal of said third resistor, a second terminal of said first capacitor, and a first terminal of each switch in said second group of switches, a second terminal of said second group of switches is respectively connected with a drain electrode of each FET coupled in said second group of FETs, a source electrode of said eighth FET is connected with a first terminal of said fourth resistor, a first terminal of said second capacitor, and a first terminal of each switch in said third group of switches, a second terminal of each switch in said third group of switches is respectively connected with a drain electrode of each FET in said third group of FETs, a source electrode of said ninth FET is connected with a second terminal of said fourth resistor, a second terminal of said second capacitor, and a first terminal of each switch in said fourth group of FETs, and a second terminal of each switch in said fourth group of switches is respectively connected with a drain electrode of each FET coupled in said fourth group of FETs.

7. The interpolation circuit, as recited in claim 6, wherein a source electrode of said first FET, a source electrode of said second FET, a second terminal of said first resistor, a source electrode of said fourth FET, a source electrode of said fifth FET, and a second terminal of said second resistor are all connected with a power source terminal, a source electrode of said third FET, a source electrode of each FET in said first group of FETs, a source electrode of each FET in said second group of FETs, a source electrode of each FET in said third group of FETs, and a source electrode of each FET in said fourth group of FETs are all connected with a ground terminal.

8. An interpolation system, comprising:

a bias generating module for providing said interpolation system with a bias voltage required for operating, a load module connected with said bias generating module, a first clock control module connected with said bias generating module and said load module, a second clock control module connected with said bias generating module and said load module, and an output module connected with said load module, wherein said load module comprises a current source sub-module for providing said interpolation system with an operating current required, and a load resistance sub-module connected with said current source sub-module for providing said interpolation system with a load required for operating, said first clock control module comprises a first input sub-module for receiving a first clock having a zero phase, a first source terminal negative feedback sub-module connected with said first input sub-module for improving a linearity and a bandwidth of said interpolation system, a first multiplex switch sub-module connected with said first source terminal negative feedback sub-module for receiving a phase rotator control word input and a first multiplex current sink sub-module connected with said first multiplex switch sub-module, said second clock control module comprises a second input sub-module, a second source terminal negative feedback sub-module connected with said second input sub-module, a second multiplex switch sub-module connected with said second source terminal negative feedback sub-module, and a second multiplex current sink sub-module connected with said second multiplex switch sub-module, and said second clock control module and said first clock control module are symmetrical in structure.

9. The interpolation system, as recited in claim 8, wherein said second clock control module comprises:

a second input sub-module for receiving a second clock having a phase orthogonal to said phase of said first clock, a second source terminal negative feedback sub-module connected with said second input sub-module for improving said linearity and said bandwidth of said interpolation system, a second multiplex switch sub-module connected with said second source terminal negative feedback sub-module for receiving a phase rotator control word input, and a second multiplex current sink sub-module connected with said second multiplex switch sub-module.

10. The interpolation system, as recited in claim 8, wherein said bias generating module comprises a first field effect transistor (FET), a second FET connected with said first FET, a third FET connected with said second FET, and a bias current terminal connected with said first FET, said current source sub-module comprises a fourth FET, and a fifth FET connected with said fourth FET, said load resistance sub-module comprises a first resistor connected with said fourth FET, and a second resistor connected with said fifth FET, said first input sub-circuit comprises a sixth FET, and a seventh FET connected with said sixth FET, said first source terminal negative feedback sub-module comprises a third resistor connected between said sixth FET and said seventh FET, and a first capacitor connected in parallel with said third resistor, said first multiplex switch sub-module comprises a first group of switches, and a second group of switches connected in parallel with said first group of switches, and said first multiplex current sink sub-module comprises a first group of FETs, and a second group of FETs connected with said second group of switches.

11. The interpolation system, as recited in claim 9, wherein said second input sub-module comprises an eighth FET, and a ninth FET connected with said eighth FET, said second source terminal negative feedback sub-module comprises a fourth resistor connected between said eighth FET and said ninth FET, and a second capacitor connected in parallel with said fourth resistor, said second multiplex switch sub-module comprises a third group of switches, and a fourth group of switches connected in parallel with said third group of switches, said second multiplex current sink sub-module comprises a third group of FETs, and a fourth group of FETs connected with said fourth group of switches, and said output module is an output terminal.

* * * * *